United States Patent [19]

Yamagiwa

[11] Patent Number: 4,558,283
[45] Date of Patent: Dec. 10, 1985

[54] CIRCUIT FOR GENERATING A SUM OR DIFFERENTIAL FREQUENCY SIGNAL

[75] Inventor: Kazuo Yamagiwa, Tokyo, Japan

[73] Assignee: Sony Corporation, Tokyo, Japan

[21] Appl. No.: 578,038

[22] Filed: Feb. 8, 1984

[30] Foreign Application Priority Data

Feb. 18, 1983 [JP] Japan .................................. 58-25814

[51] Int. Cl.$^4$ ............................................. G06G 7/161
[52] U.S. Cl. ................................... 328/160; 307/529; 332/31 T; 332/45
[58] Field of Search ............... 307/271, 525, 526, 529; 328/133, 134, 156, 158, 160; 329/101, 103; 332/16 T, 31 T, 45; 455/323, 333

[56] References Cited

U.S. PATENT DOCUMENTS 3,568,067  5/1971  Williford ............................ 325/320
4,308,471 12/1981  Misawa ............................... 307/492

Primary Examiner—Eugene R. Laroche
Assistant Examiner—James C. Lee
Attorney, Agent, or Firm—Lewis H. Eslinger; Alvin Sinderbrand

[57] ABSTRACT

There is provided a sum or differential frequency signal generating circuit for two input signals of first and second frequencies. This circuit comprises: 1st and 2nd differential amplifiers which receive the input signal of the 1st frequency and generate differential 1st and 2nd output currents having the phase difference of 90°; 3rd and 4th differential amplifiers which receive the input signal of the 2nd frequency and generate differential 3rd and 4th output currents having the phase difference of 90°; a 1st multiplier consisting of a differential amplifier for generating the multiplication output current of the output currents of the 1st and 3rd differential amplifiers; a 2nd multiplier consisting of a differential amplifier for generating the multiplication output current of the output currents of the 2nd and 4th differential amplifiers; and an output terminal at which the output currents of the 1st and 2nd multipliers are synthesized and fetched. This signal generating circuit hardly needs adjusting circuit but can suppress unnecessary signal components and is suitable for making an IC and can be applied to an SSB modulator and other similar circuits.

10 Claims, 14 Drawing Figures

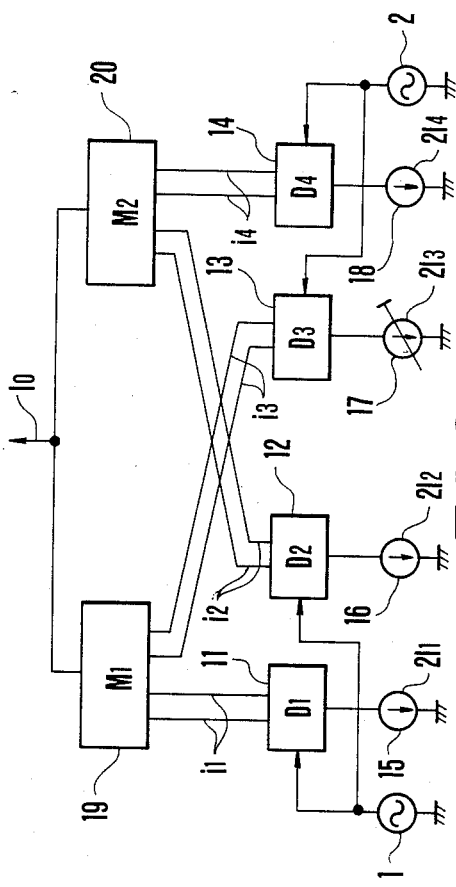
F I G. 4
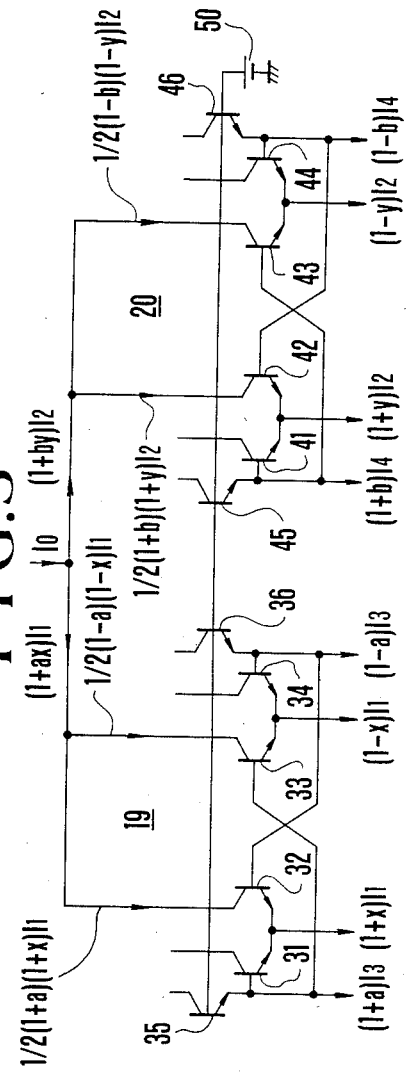
F I G. 5

CIRCUIT FOR GENERATING A SUM OR DIFFERENTIAL FREQUENCY SIGNAL

BACKGROUND OF THE INVENTION

1. Field of the Invention:

The present invention relates to a sum or differential frequency signal generating circuit for forming an output signal of the frequency of the sum or difference of the frequencies of two input signals.

2. Description of the Prior Art:

The present invention is used in a SSB (Single Side Band) modulator. FIG. 1 shows a constitution of a conventional SSB modulator, in which a reference numeral 1 denotes an input signal source of a sine wave signal of the frequency $f_1$ and 2 indicates an input signal source of a sine wave signal of the frequency $f_2$. One of these input signal sources 1 and 2 is used as a modulation signal of a predetermined band, while the other is used as a carrier signal source. Numerals 3 and 4 represent phase shifters for performing the phase shift of 90°; 5 and 6 indicate multipliers; 7 an adder; and 8 an output terminal.

A first input signal and a second input signal obtained through the phase shifter 4 are supplied to the multiplier 5, while the second input signal and the first input signal obtained through the phase shifter 3 are supplied to the multiplier 6, and the outputs of the multipliers 5 and 6 are supplied to the adder 7. A cosine wave signal appears at the outputs of the phase shifters 3 and 4, while a sine wave output signal having a frequency of the sum of the frequencies of the two individual sine waves, $(f_1+f_2)$, appears from the adder 7 as shown in FIG. 2A. FIGS. 2A and 2B show the case where the first and second input signals each have a single frequency for the purpose of simplicity.

In addition, by inverting the phase of the output of the multiplier 5 and supplying it to the adder 7, a output sine wave signal having the frequency $(f_2-f_1)$, or the difference between the frequencies of the two individual sine waves appears at the output terminal 8 as shown in FIG. 2B. As obvious from FIGS. 2A and 2B, only the signal to be modulated (single side band) is obtained in the SSB modulator. For example, as shown in FIGS. 2A and 2B, assuming that the carrier frequency is $f_2$ and the output to be modulated has a frequency near the carrier frequency $f_2$, it is difficult to remove the carrier component by a filter; therefore, it is advantageous to use the SSB modulating method. More practically, in the case where a chrominance signal is low-frequency converted and a luminance signal is FM modulated and where FM modulation audio signals having different carrier frequencies on each of the adjacent tracks are inserted between those signals, the SSB modulator is used to convert the carrier frequencies of the FM modulation audio signals into the desired values. In this case, frequencies such as $f_1=150$ kHz and $f_2=1.3$ MHz are used.

As shown in FIG. 1, when the phase shifters 3 and 4, and the multipliers 5 and 6 are constituted by separate circuit blocks, the circuit arrangement and also the adjusting means for each circuit block and the amplitude adjusting means for the output of the multipliers 5 and 6 become complicated i.e., a total of four adjusting means were needed.

Firstly, there is a problem of the carrier leak such that the signal component of $f_1$ or $f_2$ appears at the outputs of the multipliers 5 and 6 in addition to the normal signal component of $(f_1+f_2)$ or $(f_2-f_1)$. In particular, it is difficult to remove the signal component (i.e., component of the frequency $f_2$) close to the frequency $(f_1+f_2$ or $f_2-f_1$ in FIG. 2) of the output to be modulated among this carrier leak by a filter. To prevent this carrier leak, it was necessary to adjust the carrier balance of the multipliers 5 and 6.

Secondly, unnecessary components appear in the output signal even when phase shift amounts $\phi_1$ and $\phi_2$ of the phase shifters 3 and 4 have errors. The output signal is the signal obtained by adding the outputs of the multipliers 5 and 6 and is represented by the following expression:

$$K_1 \cdot \sin\omega_1 t \cdot \sin(\chi_2 t + \phi_2) + K_2 \sin\omega_2 t \cdot \sin(\omega_1 t + \phi_1) = K_3 \cdot \sin(\omega_1 + \omega_2)t.$$

Each of the phase shift amounts $\phi_1$ and $\phi_2$ has to be 90° in order to obtain the result $K_3 \cdot \sin(\omega_1 + \omega_2)t$ in the above expression. When there is an error, the unnecessary component of $(\omega_2 - \omega_1)$ appears. It is difficult to remove this unnecessary component by a filter in the case where the frequency of the unnecessary component is close to the frequency of the output to be modulated.

Thirdly, when the levels of the output signals of the two multipliers 5 and 6 are not equal, the unnecessary component of $(\omega_2 - \omega_1)$ is also produced. Coefficients $K_1$ and $K_2$ in the above expression denote the gains of the output signals of the multipliers 5 and 6. When $(K_1 \neq K_2)$, the unnecessary signal component is generated. In a conventional circuit arrangement, the outputs of the multipliers 5 and 6 were balanced in the adder 7.

OBJECTS AND SUMMARY OF THE INVENTION

It is an object of the present invention to provide a circuit for generating a sum or differential frequency signal which can suppress the unnecessary signal component without substantially requiring adjusting means.

According to the present invention, it is possible to realize a circuit for generating a sum or differential frequency signal which is suitable for making an integrated circuit.

The present invention provides a circuit to which input signals of first and second frequencies are supplied and which generates an output signal of the frequency of the sum or difference of these first and second frequencies, wherein this circuit comprises: first and second differential amplifiers to which an input signal of the first frequency is supplied and which generate differential first and second output currents having the phase difference of 90° with each other; third and fourth differential amplifiers to which an input signal of the second frequency is supplied and which generate differential third and fourth output currents having the phase difference of 90° with each other; a first multiplier constituted by a differential amplifier for generating the multiplication output current of the output currents of the first and third differential amplifiers; a second multiplier constituted by a differential amplifier for generating the multiplication output current of the output currents of the second and fourth differential amplifiers; and an output terminal at which the output currents of the first and second multipliers are synthesized and fetched.

The present invention will be apparent from the following detailed description taken in conjunction with the accompanying drawings.

BRIEF DESCRIPTION OF THE DRAWINGS

FIG. 4 is a block diagram showing an embodiment of the present invention;

FIG. 5 is a connection diagram which is used to describe multipliers which can be used in the present invention;

DESCRIPTION OF PREFERRED EMBODIMENTS

Figure 3:
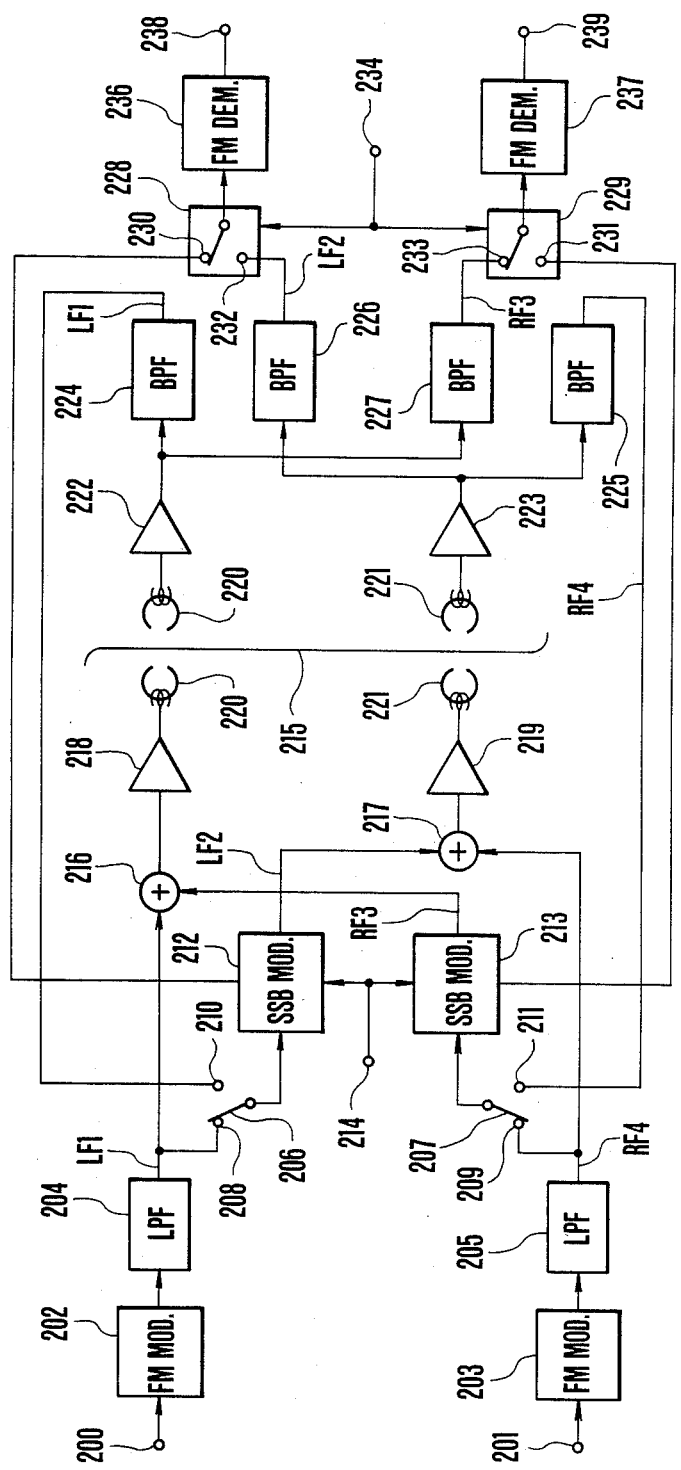
FIG. 3 is a block diagram showing an example of an audio signal recording apparatus to which the present invention is applied.

FIG. 3 shows an apparatus for recording stereo audio signals to which the present invention can be applied. Although FIG. 3 does not explicitly show the operations, this recording apparatus is used to FM modulate a luminance signal in a color video signal; to convert a carrier chrominance signal into a signal of the low-band carrier frequency; and to record the FM modulated stereo audio signals between the band of the FM modulation luminance signal and the band of the chrominance signal of which the carrier frequency was converted.

In FIG. 3, the signals in the right and left channels of the stereo audio signals are supplied to input terminals indicated by reference numerals 200 and 201, respectively. These signals are supplied to FM modulators 202 and 203, so that the carrier signals of the frequencies $F_1$ and $F_4$ are FM modulated. The respective outputs of the FM modulators 202 and 203 are supplied to low-pass filters 204 and 205. The output signal LF1 of the low-pass filter 204 is supplied to an input terminal 208 on the recording side of a switching circuit 206 and to an adder 216, while the output signal RF4 of the low-pass filter 205 is supplied to an input terminal 209 on the recording side of a switching circuit 207 and to an adder 217.

The audio FM signal LF1 output from the switching circuit 206 is supplied to an SSB modulator 212, while the audio FM signal RF4 output from the switching circuit 207 is supplied to an SSB modulator 213. A carrier signal of a predetermined frequency $f_1$, e.g., 150 kHz is supplied from a terminal 214 to the SSB modulators 212 and 213. Therefore, the signal LF2 of the carrier of frequency $F_2=(F_1+f_1)$ is output from the SSB modulator 212, while the signal RF3 of the carrier of frequency $F_3=(F_4+f_1)$ is output from the SSB modulator 213. The signal RF3 is supplied to the adder 216 and the signal LF2 is supplied to the adder 217.

The output of the adder 216 is supplied to a rotary head 220 through a recording amplifier 218 and a rotary transformer (not shown), while the output of the adder 217 is supplied to a rotary head 221 through a recording amplifier 219 and a rotary transformer (not shown). The rotary heads 220 and 221 are disposed on a rotary disk at an angular distance of 180° and rotate at the field frequency (60 Hz). The rotary heads 220 and 221 alternately come into contact with a magnetic tape 215 which is wrapped around the peripheral surface of a tape guide drum, so that the stereo audio signals together with the color video signal are recorded on the magnetic tape 215.

The stereo audio signals reproduced by the rotary heads 220 and 221 are supplied to reproducing amplifiers 222 and 223. The output signal of the reproducing amplifier 222 is supplied to band-pass filters 224 and 227, while the output signal of the reproducing amplifier 223 is supplied to band-pass filters 225 and 226. The signal LF1 separated by the band-pass filter 224 is supplied to an input terminal 210 on the reproducing side of the switching circuit 206 and is supplied through this switching circuit 206 to the SSB modulator 212. The signal converted into the carrier frequency $F_2$ by the SSB modulator 212 is supplied to one input terminal 230 of a switching circuit 228. The signal LF2 separated by the band-pass filter 226 is supplied to another input terminal 232 of this switching circuit 228.

The signal RF4 separated by the band-pass filter 225 is supplied to the input terminal 211 on the reproducing side of the switching circuit 207 and is supplied through this switching circuit 207 to the SSB modulator 213. The signal converted into the carrier frequency $F_3$ by the SSB modulator 213 is supplied to one input terminal 231 of a switching circuit 229. The signal RF3 separated by the band-pass filter 227 is supplied to another input terminal 233 of this switching circuit 229.

Both signals to be supplied to the two input terminals 230 and 232 of the switching circuit 228 are simultaneously the audio signal in the left channel and the signals having the carrier frequency $F_2$. Both signals to be supplied to the two input terminals 231 and 233 of the switching circuit 229 are simultaneously the audio signal in the right channel and the signals having the carrier frequency $F_3$. The switching circuits 228 and 229 are controlled by a switching pulse whose level changes for every field interval to be supplied from a terminal 234. Thus, on one hand in one field where the rotary head 220 scans the magnetic tape 215, the input terminal 230 of the switching circuit 228 and the input terminal 233 of the switching circuit 229 are selected. On the other hand, in one field where the rotary head 221 scans the magnetic tape 215, the input terminal 232 of the switching circuit 228 and the input terminal 231 of the switching circuit 229 are selected. The output signal of the switching circuit 228 is supplied to an FM demodulator 236, so that the reproduction audio signal in the left channel is obtained at an output terminal 238. The output signal of the switching circuit 229 is supplied to an FM demodulator 237, so that the reproduction audio signal in the right channel is obtained at an output terminal 239.

As described above, the present invention is applied to the SSB modulators 212 and 213 of a recording and reproducing apparatus for recording and reproducing the FM modulation audio signals having different carrier frequencies on each of the adjacent tracks.

FIG. 4 shows the fundamental embodiment constitution of the present invention. The first input signal source (voltage source) 1 of the frequency $f_1$ is connected to input terminals of first and second differential amplifiers 11 and 12. The second input signal source (voltage source) 2 of the frequency $f_2$ is connected to input terminals of third and fourth differential amplifiers 13 and 14. Constant current sources 15, 16, 17 and 18 for allowing constant currents of $2I_1$, $2I_2$, $2I_3$ and $2I_4$ to flow are connected to these differential amplifiers 11, 12, 13 and 14.

The differential amplifiers 11 and 12 include a resistor and a capacitor, (not shown) respectively, and loop currents $i_1$ and $i_2$ having the phase difference of 90° are respectively generated therefrom. The output current $i_1$ is supplied to a multiplier 19, while the output current $i_2$ is supplied to a multiplier 20. Similarly, the differential amplifiers 13 and 14 include a resistor and a capacitor (not shown) and output currents $i_3$ and $i_4$ having the phase difference of 90° are generated therefrom and are supplied to the multipliers 19 and 20, respectively.

The multipliers 19 and 20 serve to generate the multiplication output currents ($i_1 \cdot i_3$) and ($i_2 \cdot i_4$) of the currents $i_1$ through $i_4$ to be supplied from the differential amplifiers 11, 12, 13 and 14, respectively. The output currents of these multipliers 19 and 20 are synthesized and fetched as an output current $I_0$. This output current $I_0$ has the component of the sum of the frequencies of the two input signals.

FIG. 5 shows one embodiment of an example of the multipliers 19 and 20. The multiplier 19 includes a differential amplifier consisting of transistors 31 and 32 and a differential amplifier consisting of transistors 33 and 34. The multiplier 20 includes a differential amplifier consisting of transistors 41 and 42 and a differential amplifier consisting of transistors 43 and 44. In addition, the base of the transistor 31, the base of the transistor 33 and the emitter of the transistor 35 are connected. The base of the transistor 32, the base of the transistor 34 and the emitter of the transistor 36 are connected. The base of the transistor 41, the base of the transistor 43 and the emitter of the transistor 45 are connected. The base of the transistor 42, the base of the transistor 44 and the emitter of the transistor 46 are connected.

The bases of these transistors 35, 36, 45 and 46 are connected to a common DC voltage source 50, while the collectors of these transistors are connected to a common power source line (not shown). As shown in an embodiment (FIG. 13) which will be described later, the output terminal of the differential amplifier 13 is connected to the emitters of transistors 35 and 36 of the multiplier 19, and the output terminal of the differential amplifier 11 is connected to the common connecting point of the emitters of the transistors 31 and 32 and to the common connecting point of the emitters of the transistors 33 and 34. Similarly, the output terminal of the differential amplifier 14 is connected to the emitters of the transistors 45 and 46 of the multiplier 20, while the output terminal of the differential amplifier 12 is connected to the emitter common connecting point of the transistors 41 and 42 and to the emitter common connecting point of the transistors 43 and 44.

The following parameters are formed from the respective loop currents $i_1$, $i_2$, $i_3$ and $i_4$ and the respective constant currents $I_1$, $I_2$, $I_3$ and $I_4$ of the differential amplifiers 11, 12, 13 and 14.

$$x = \frac{i_1}{I_1}, y = \frac{i_2}{I_2}, a = \frac{i_3}{I_3}, b = \frac{i_4}{I_4}$$

The differential output currents of the differential amplifiers 11, 12, 13 and 14 are the currents of which the loop currents $\pm i_1$, $\pm i_2$, $\pm i_3$ and $\pm i_4$ as the AC components were added to the constant currents $I_1$, $I_2$, $I_3$ and $I_4$ as the DC components. Therefore, the output currents of the respective differential amplifiers are represented by the following expressions.

Output current of the differential amplifier 11:

$(I_1+i_1)=(1+x) I_1$ $(I_1-i_1)=(1-x) I_1$

Output current of the differential amplifier 12:

$(I_2+i_2)=(1+y) I_2$ $(I_2-i_2)=(1-y) I_2$

Output current of the differential amplifier 13:

$(I_3+i_3)=(1+a) I_3$ $(I_3-i_3)=(1-a) I_3$

Output current of the differential amplifier 14:

$(I_4+i_4)=(1+b) I_4$ $(I_4-i_4)=(1-b) I_4$

When the output currents of these differential amplifiers are supplied, the respective collector currents of the transistors 32 and 33 become $\frac{1}{2}(1+a)(1+x) I_1$ and $I_1$ and $\frac{1}{2}(1-a)(1-x) I_1$ The current of $(1+ax) I_1$ at the common connecting point of the collectors of these transistors 32 and 33.

The collector currents of the transistors 42 and 43 of the multiplier 20 become $\frac{1}{2}(1-b)(1-y) I_2$ and $\frac{1}{2}(1+b)(1-y) I_2$ The current of $(1+by) I_2$ is generated at the common connecting point of the collectors of transistors 42 and 43. Furthermore, the collectors of the transistors 32, 33, 42 and 43 are commonly connected and the output current $I_0$ is fetched therefrom. This output current $I_0$ becomes $$I_0 = (1 + ax) I_1 + (1 + by) I_2$$
$$= I_1 + I_2 + ax I_1 + by I_2$$

in which ($I_1+I_2$) is the DC component and (ax $I_1$+by $I_2$) is the AC component ($I_o$). This AC component $I_0$ becomes $$\overline{I_o} = \frac{i_1 \cdot i_3}{I_3} + \frac{i_2 \cdot i_4}{I_4}$$

and is the multiplication output.

In the above-mentioned multipliers 19 and 20, if the respective DC components of the differential amplifiers 11, 12, 13 and 14 are unbalanced, a carrier leak is caused in the multiplication output. In an example of the multiplier 19, since the DC balance of the differential amplifiers 11 and 13 is lost, the coefficients of these output currents include coefficients X and A with respect to the DC components, such as (X+x') and (A+a'). Therefore, the output current of the multiplier 19 becomes $$(1+(A+a')(X+x'))I_1 = 1+AX+a'x'+a'x'$$

Figure 1:
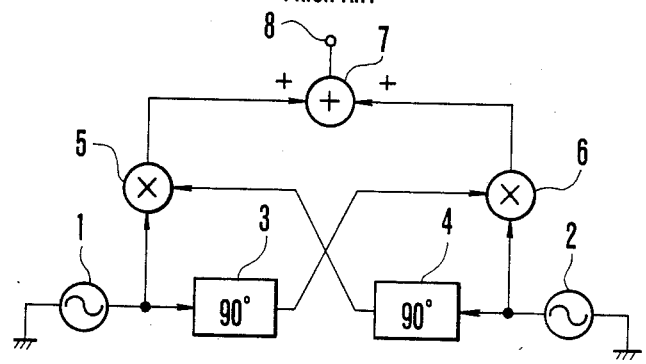
FIGS. 1, 2A and 2B are a block diagram and frequency spectrum diagrams which are used to describe a conventional SSB modulator.
Figure 2A:
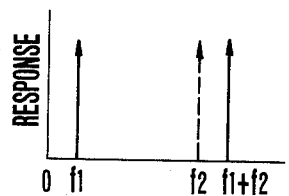
Figure 2B:
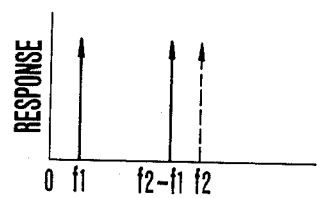

In this expression, the term of $(1 +AX)$ is the DC component, $a'x'$ is the necessary multiplication output, and $a'x$ and $x'A$ are the carrier leak components.

$$x' = K_1 \sin\omega_1 t \quad a' = K_2 \sin\omega_2 t$$
(where, $0 < K_1, K_2 < 1$), the DC component X causes the signal of the angular frequency $\omega_2$ of the carrier leak, while the DC component A causes the signal of the angular frequency $\omega_1$ of the carrier leak. In the case where the frequency relationship is as shown in FIG. 2A, the carrier leak ($\omega_2$) near the frequency $(f_1+f_2)$ of the output signal becomes a problem in particular.

In addition, assuming that $i_1 = K_1 \sin \omega_1 t$
$i_2 = K_2 \cos \omega_1 t$
$i_3 = K_3 \cos \omega_2 t$
$i_4 = K_4 \sin \omega_2 t$ the AC component $I_0$ of the output current $I_0$ becomes $$\overline{I_0} = \frac{K_1 K_3}{2I_3} [\sin(\omega_1 + \omega_2)t + \sin(\omega_1 - \omega_2)t] +$$

$$\frac{K_2 K_4}{2I_4} [\sin(\omega_1 + \omega_2)t - \sin(\omega_1 - \omega_2)t]$$

As obvious from the above expression, when $$\left( \frac{K_1 K_3}{2I_3} \neq \frac{K_2 K_4}{2I_4} \right),$$

the component of $\sin(\omega_1 - \omega_2)t$ is caused to generate. The component of $\sin(\omega_1 - \omega_2)t$ is undesirably at a frequency near the inherent frequency of the output signal. Therefore, it is necessary to satisfy that $$\left( \frac{K_1 K_3}{2I_3} = \frac{K_2 K_4}{2I_4} \right)$$

for this component to be eliminated. In other words, even if the gains of the differential amplifiers 11, 12, 13 and 14 are not equal, it is enough that the equation of the above expression is satisfied. Due to this, as shown in FIG. 4, in the present invention, for example the constant current $2I_3$ of the constant current source 17 of the differential amplifier 13 is adjusted to compensate the variation of the gain, thereby preventing the occurrence of the unnecessary signals.

Some examples of the differential amplifiers 11 and 12 constituted so as to perform a phase shift of 90° will be described. The following embodiment is also similarly applied to the differential amplifiers 13 and 14.

Figure 6:
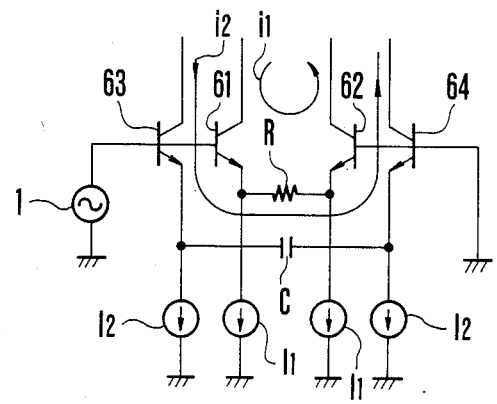
FIG. 6 is a connection diagram showing a first example of a differential amplifier having the phase shift function which can be used in the present invention.

As shown in FIG. 6, the differential amplifier 11 is constituted by transistors 61 and 62, and the differential amplifier 12 is constituted by transistors 63 and 64. A constant current source of $I_1$ is connected to the respective emitters of the transistors 61 and 62 and at the same time both emitters are connected through a resistor R. In addition, a constant current source of $I_2$ is connected to the respective emitters of the transistors 63 and 64 and at the same time both emitters are connected through a capacitor C. The input signal voltage source 1 is connected to the bases of the transistors 61 and 63. Also, a predetermined DC bias voltage (not shown) is applied to the bases of the transistors 61, 62, 63 and 64.

In this arrangement shown in FIG. 6, assuming that the input signal voltage is $e_1$ and ($S=j\omega_1$), $$i_1 \approx \frac{1}{R} \cdot e_1$$

$$i_2 \approx e_1 \cdot CS$$

there is a relationship between the loop currents $i_1$ and $i_2$ that they have the phase difference of 90°.

Figure 7:
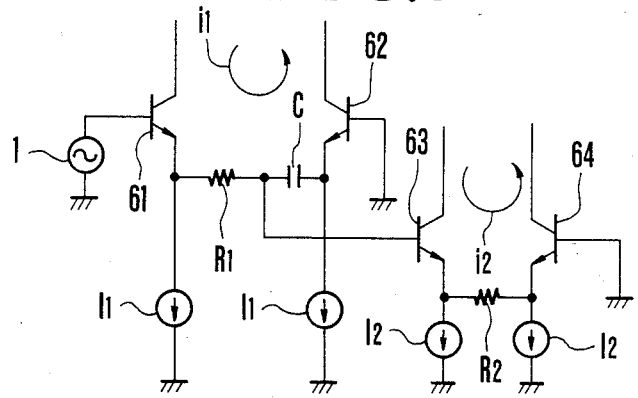
FIG. 7 is a connection diagram showing a second example of the differential amplifier having the phase shift function.

FIG. 7 shows a second example of the differential amplifiers 11 and 12 having the phase shift function. The input signal voltage source 1 is connected to the differential amplifier 11 consisting of the transistors 61 and 62. The constant current source of the constant current $I_1$ is connected to the emitters of the transistors 61 and 62. A DC circuit consisting of a resistor $R_1$ and capacitor C is interposed between the emitters of the transistors 61 and 62. In addition, the base of the transistor 63 is connected to the connecting point of the resistor $R_1$ and capacitor C. A resistor $R_2$ is interposed between the emitter of the transistor 63 and the emitter of the transistor 64. The constant current source of $I_2$ is connected to the emitters of these transistors 63 and 64, respectively. Although not shown, a DC bias is applied to the transistors 61, 62, 63 and 64.

In this arrangement shown in FIG. 7, $$i_1 = \frac{CS}{1 + CR_1 S} \cdot e_1$$

$$i_2 = \frac{1}{1 + CR_1 S} \cdot \frac{1}{R_2} \cdot e_1$$

thus, the loop currents $i_1$ and $i_2$ cross at right angles.

Figure 8:
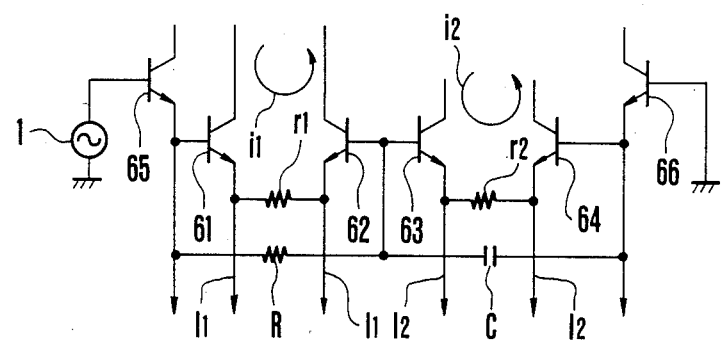
FIG. 8, 9 and 10 are connection diagrams showing a third example of the differential amplifier having the phase shift function and the constitutions in which a part thereof is modified.

FIG. 8 shows a third example of the differential amplifier having the phase shift function. The constant current source of $I_1$ is connected to the respective emitters of the transistors 61 and 62. The constant current source of $I_2$ is connected to the emitters of the transistors 63 and 64, respectively. The emitters of the transistors 61 and 62 are coupled through a resistor $r_1$. The emitters of the transistors 63 and 64 are coupled through a resistor $r_2$.

Furthermore, a transistor 65 having the base to which the input signal voltage source 1 is connected is provided. Although not shown, a predetermined DC bias voltage is applied to the respective bases of this transistor 65 and a transistor 66, and at the same time the constant current source is connected to the respective emitters. A series circuit consisting of the resistor R and capacitor C is connected between the emitter of this transistor 65 and the emitter of the transistor 66. The emitter of the transistor 65 and the base of the transistor 61 are connected. The emitter of the transistor 66 and the base of the transistor 64 are connected. The bases of the transistors 62 and 63 are connected to the connecting point of the resistor R and capacitor C.

In this arrangement shown in FIG. 8, the loop current $i_1$ of the differential amplifier 11 consisting of the transistors 61 and 62 is the current of which the voltage drop to be caused at the resistor R was divided by the resistor $r_1$, while the loop current $i_2$ of the differential amplifier 12 consisting of the transistors 63 and 64 is the current of which the voltage drop to be caused at the capacitor C was divided by the resistor $r_2$. That is to say, $$i_1 = \frac{CRS}{1 + CRS} \cdot e_1 \cdot \frac{1}{r_1}$$

$$i_2 = \frac{1}{1 + CRS} \cdot e_1 \cdot \frac{1}{r_2}$$

These loop currents $i_1$ and $i_2$ have the phase difference of 90°.

Figure 9:
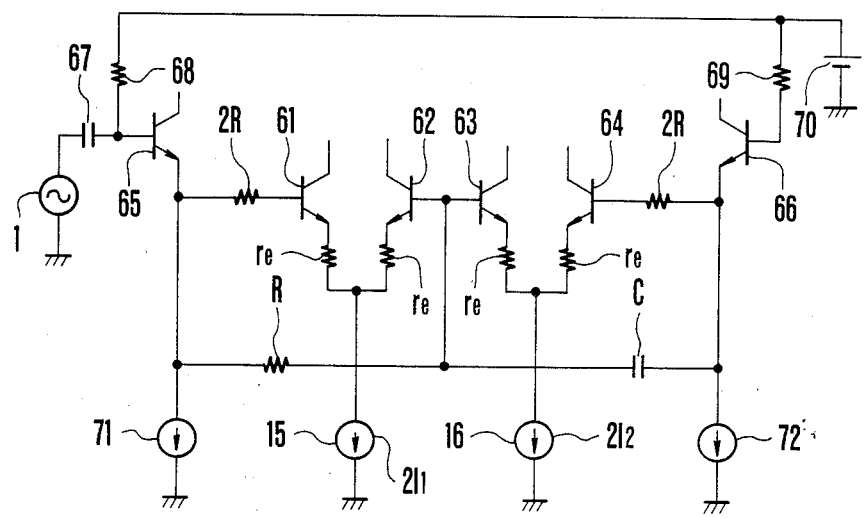

FIG. 9 shows a more practical constitution than that shown in FIG. 8. The emitters of the transistors 61 and 62 are connected to the constant current source 15 of $2I_1$ through a resistor $r_e$, respectively. The emitters of the transistors 63 and 64 are connected to the constant current source of $2I_2$ through the resistor $r_e$, respectively. In addition, the input signal voltage source 1 is connected to the base of the transistor 65 through a capacitor 67. A DC voltage source 70 is connected to the bases of the transistors 65 and 66 through resistors 68 and 69. Furthermore, a resistor 2R is interposed between the base of the transistor 61 and the emitter of the transistor 65 and between the base of the transistor 64 and the emitter of the transistor 66, respectively. Constant current sources 71 and 72 are connected to the emitters of the transistors 65 and 66.

Assuming that the DC base current of each of the transistors 61, 62, 63 and 64 is $I_B$, the current of IB flows through the resistor 2R and the current of $I_B$ also flows through the resistor R; therefore, it is possible to mutually equalize each base potential of the transistors 61, 62, 63 and 64 thereby enabling the DC balance to be kept.

The resistor R cannot be set at a relatively small value due to the relation with the capacitor C. In other words, in the case of making an integrated circuit (IC), it is difficult to form a capacitor having a large capacitance. Thus, in order to equalize the magnitudes of the loop currents $i_1$ and $i_2$ as much as possible, the resistor R has to be set at a large value, and the base resistor 2R also must have a large value. Since this base resistor 2R has a large value, there is concern that an unnecessary phase deviation (namely, undesirable phase change) may occur in the signal current.

Figure 10:
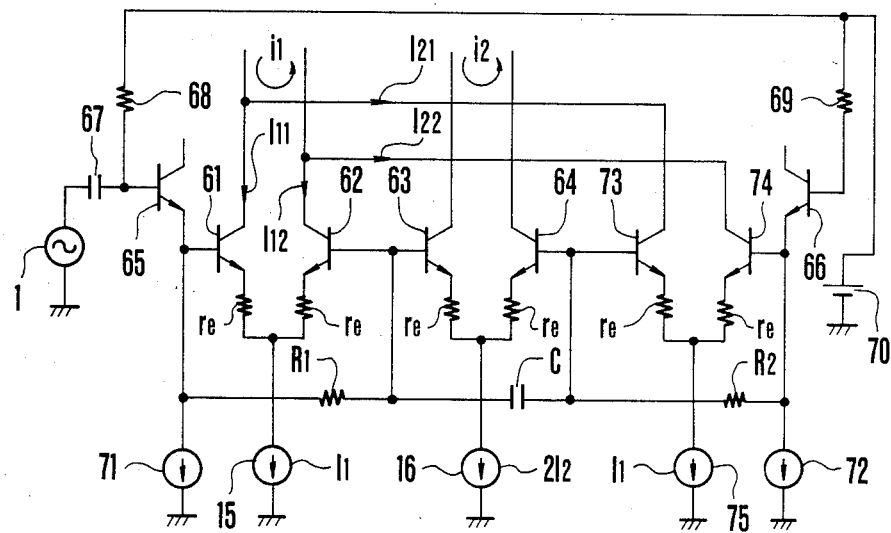

FIG. 10 shows a circuit embodiment which overcomes this problem. In FIG. 10, transistors 73 and 74 are provided and the emitters of the transistors 73 and 74 are each connected to a constant current source 75 of $I_1$ through a resistor $r_e$, thereby constituting a differential amplifier. In addition, the collector of the transistor 61 and the collector of the transistor 73 are connected, while the collector of the transistor 62 and the collector of the transistor 74 are connected. The constant current source 15 connected to the emitters of the transistors 61 and 62 serves to allow the constant current of $I_1$ to flow.

The base of the transistor 64 and the base of the transistor 73 are mutually connected, and a series circuit consisting of the resistor $R_1$ and capacitor C is connected between this connecting point and the connecting point of the base of the transistor 61 and the emitter of the transistor 65. In addition, the base of the transistor 62 and the base of the transistor 63 are mutually connected, and this connecting point is connected to the above branch of the series circuit at the point between $R_1$ and C. Finally, the emitter of the transistor 66 and the base of the transistor 74 are mutually connected, and this connecting point is connected to one end of another branch of the series circuit consisting of the resistor $R_2$. The other end of this branch of the series circuit containing $R_2$ is connected to the base connecting point of the transistors 64 and 73.

In the circuit arrangement of FIG. 10, assuming that the DC components of the respective collector currents of the transistors 61, 62, 73 and 74 are $I_{11}$, $I_{12}$, $I_{21}$ and $I_{22}$, the DC balance is lost since the base resistor 2R is not connected, and even if $(I_{11} > I_{12})$, there will be the relation of $(I_{22} > I_{21})$ will exist in the differential amplifier consisting of the transistors 73 and 74. Therefore, $(I_{11} + I_{21} \approx I_{12} + I_{22})$ by synthesizing both DC components, so that it is possible to supply the DC balanced output current to the multiplier 19. In this arrangement shown in FIG. 10, it is unnecessary to provide the base resistor 2R of a large value, but the impedance of the signal source can be reduced and the previously-mentioned phase deviation (undesirable phase change) can be prevented.

In addition, assuming that the voltage drop to be caused at the resistor $R_1$ is $e_{R1}$ and the voltage drop to be caused at the capacitor C is $e_C$ and the voltage drop to be caused at the resistor $R_2$ is $e_{R2}$, these values are as represented by the following expressions.

$$e_{R1} = \frac{CR_1 S}{1 + C(R_1 + R_2)S} \cdot e_1$$

$$e_{R2} = \frac{CR_2 S}{1 + C(R_1 + R_2)S} \cdot e_1$$

$$e_C = \frac{1}{1 + C(R_1 + R_2)S} \cdot e_1$$

Furthermore, assuming that the loop current of the differential amplifier consisting of the transistors 61 and 62 is $i_{11}$ and the loop current of the differential amplifier consisting of the transistors 73 and 74 is $i_{12}$, $$i_{11} = \frac{e_{R1}}{2r_e} \quad i_{12} = \frac{e_{R2}}{2r_e} \quad i_1 = i_{11} + i_{12}$$

Therefore, the loop currents $i_1$ and $i_2$ cross at right angles. Furthermore, if $(R_1 \approx R_2)$, the DC balance can be kept in the differential amplifier consisting of the transistors 63 and 64 can be maintained.

In addition, the improvement of the AC balance of the differential amplifiers 11, 12, 13 and 14 is effective to prevent the carrier leak and as described above, an additional phase deviation (undesirable phase change) is prevented by reducing the signal source impedance and decreasing the floating capacities of the transistors constituting the constant current source and of the transistors constituting the differential amplifiers.

The influences due to the variation of the values of the circuit elements and the temperature drift will be further described. Even if the values of the capacitor C or resistor vary due to these influences, the phase shift amount is maintained to be substantially 90°. However, the fluctuation of the gains $K_1$, $K_2$, $K_3$ and $K_4$ and the fluctuation of the constant currents $I_3$ and $I_4$ become a cause of the generation of the unnecessary signals such as mentioned above.

Figure 11:
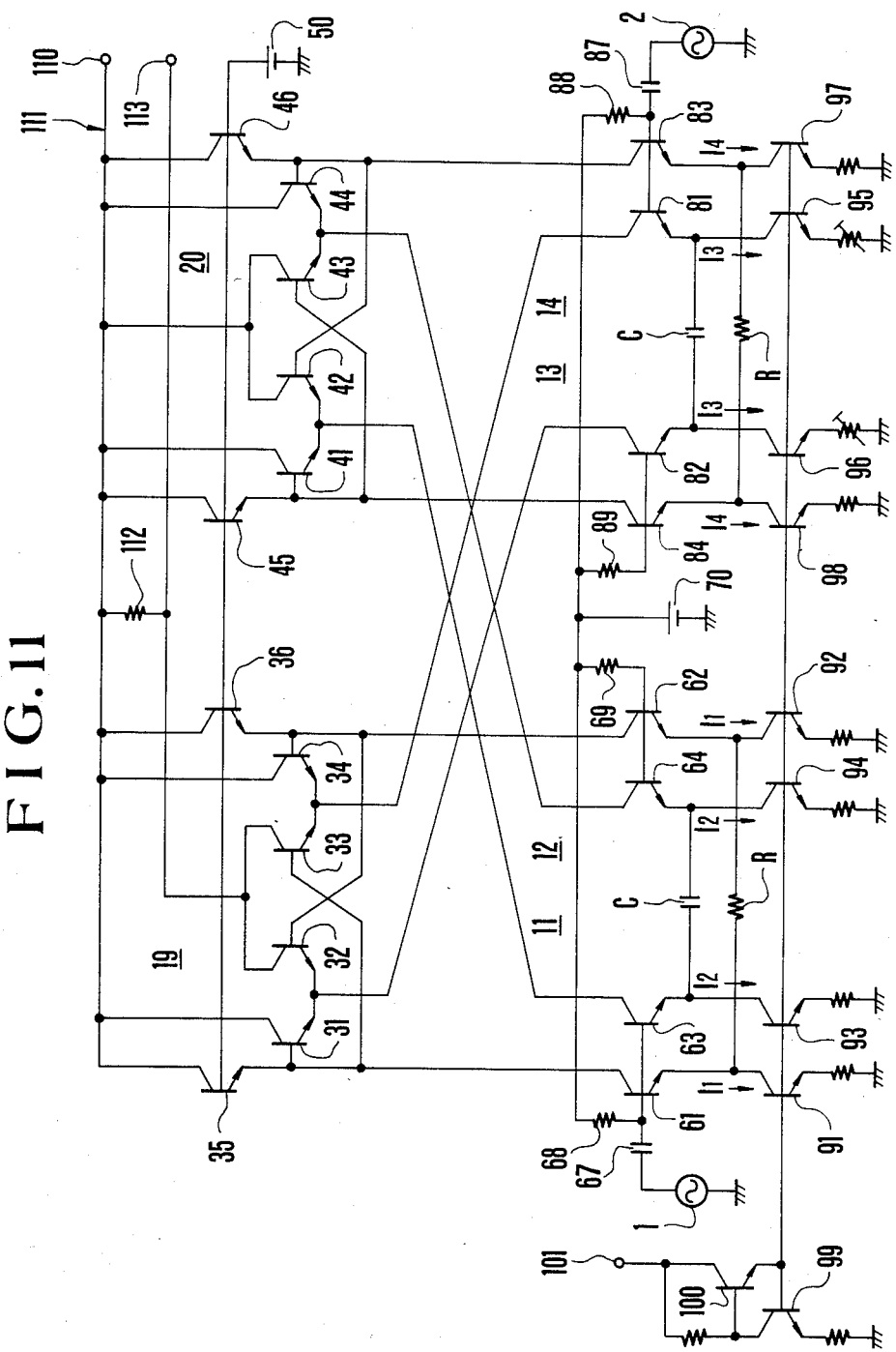
FIG. 11 is a connection diagram showing a first embodiment of the present invention.

In the case of using the differential amplifiers 11, 12, 13 and 14 with such constitutions as shown in FIG. 11, assuming that the resistor and capacitor included in the differential amplifiers 11 and 12 are respectively $R_1$ and $C_1$ and the resistor and capacitor included in the differential amplifiers 13 and 14 are respectively $R_2$ and $C_2$, and that the voltage drops to be caused at these elements are $e_{R1}$, $e_{C1}$, $e_{R2}$ and $e_{C2}$, the following proportional relationships are satisfied.

$$K_1, i_1 \propto \frac{1}{R_1}, e_{R1} \quad K_2, i_2 \propto C_1 S, e_{C1}$$

$$K_3, i_2 \propto C_1 S, e_{C1} \quad K_4, i_4 \propto \frac{1}{R_2}, e_{R2}$$

In addition, the constant currents $I_3$ and $I_4$ are proportional to the emitter resistance of the transistor for the constant current source which was made as an IC. Therefore, each parameter of the equation $$\left( \frac{K_1 K_3}{2I_3} = \frac{K_2 K_4}{2I_4} \right)$$

changes in the same direction since the resistors $R_1$, $R_2$ and the capacitors $C_1$, $C_2$ change in the same direction in dependence upon the temperature change, thereby enabling the relation of this equation to be maintained. The variation of the values of the circuit elements can be compensated for by changing the value of one of the constant currents, e.g., $I_3$, in this equation.

A first embodiment of the present invention mentioned above will be described with reference to FIG. 11. The first embodiment is constituted in the manner such that the multipliers shown in FIG. 5 and the differential amplifiers having the phase shift function shown in FIG. 6 are combined.

The input signal voltage source 1 of the frequency $f_1$ is connected to the differential amplifiers 11 and 12 through the capacitor 67, and at the same time the DC voltage source 70 is connected thereto through the resistors 68 and 69. The collectors of transistors 91 and 92 constituting the constant current source are connected to the respective emitters of the transistors 61 and 62 of this differential amplifier 11. The collectors of transistors 93 and 94 constituting the constant current source are connected to the respective emitters of the transistors 63 and 64 of the differential amplifier 12. The emitters of these transistors 91, 92, 93 and 94 are grounded through resistors, while each base thereof is connected to the base of a transistor 99 and to the emitter of a transistor 100. The emitter of this transistor 99 is grounded through a resistor and at the same time its collector is connected to the base of the transistor 100. The collector of the transistor 99 is also connected to a DC power source terminal 101 through a resistor, while the collector of the transistor 100 is also connected to the DC power source terminal 101.

These transistors 99 and 100 and the transistor 91 (92, 93, 94) constitute the constant current source, so that the constant current $I_1$ corresponding to the collector current of the transistor 99 flows through the transistor 91 (92, 93, 94). As the constant current source, it is possible to use another constitution such that a series circuit consisting of a diode and a resistor is connected between the DC power terminal and the ground and the base of the transistor 91 (92, 93, 94) is connected to this connecting point.

In addition, similarly to the differential amplifiers 11 and 12, the differential amplifiers 13 and 14 comprise: transistors 81, 82, 83 and 84; a resistor R; a capacitor C; and transistors 95, 96, 97 and 98 for the constant current source. The input signal voltage source 2 of the frequency $f_2$ is connected to these differential amplifiers 13 and 14 through a capacitor 87, and at the same time the DC voltage source 70 is connected thereto through resistors 88 and 89. Two variable impedance elements which interlockingly change are used as the emitter resistances of the transistors 95 and 96 in order to vary the value of the constant current $I_3$. The values of these variable impedance elements are controlled by the DC voltage.

The collector currents of the transistors 61 and 62 of the differential amplifier 11 have the same phase as the signal current from the input signal voltage source 1, while the collector current of the transistors 63 and 64 of the differential amplifier 12 and the above signal current have a phase difference of 90°. There is the phase difference of 90° between the collector currents of the transistors 81 and 82 of the differential amplifier 13 and the collector currents of the transistors 83 and 84 of the differential amplifier 14.

The output current of the differential amplifier 11 is supplied to the emitters of the transistors 35 and 36 of the multiplier 19. The output current of the differential amplifier 13 is supplied to the emitter common connecting point of the transistors 31 and 32 of the multiplier 19 and to the emitter common connecting point of the transistors 33 and 34, respectively. The output currents of the differential amplifiers 12 and 14 are supplied to the multiplier 20. The collectors of the transistors 32 and 33 of the multiplier 19 and the collectors of the transistors 42 and 43 of the multiplier 20 are commonly connected. In addition, a reference numeral 110 denotes a power source terminal and a power source line 111 is extended from this power source terminal 110. The collector common connecting point of the transistors of the above-mentioned multipliers is connected to the power source line 111 through a load resistance 112 and at the same time it is led out as an output terminal 113. The output signal voltage of the frequency of $(f_1 + f_2)$ is fetched at this output terminal 113.

Figure 12:
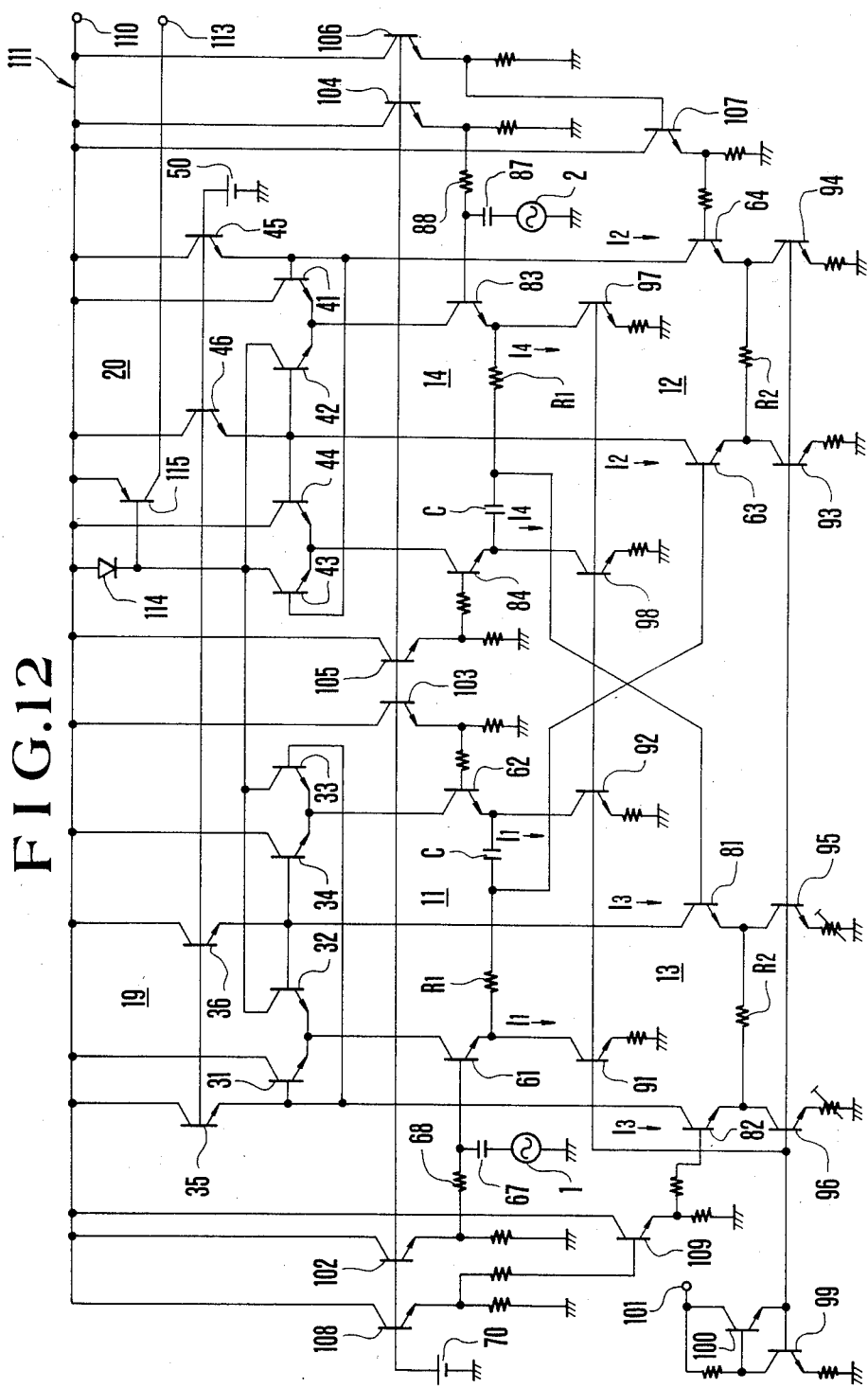
FIG. 12 is a connection diagram showing a second embodiment of the present invention.

FIG. 12 shows a second embodiment of the present invention. This second embodiment is constituted using the differential amplifiers of the arrangement shown in FIG. 7.

The collectors of the transistors 91 and 92 constituting the constant current source are connected to the respective emitters of the transistors 61 and 62 constituting the differential amplifier 11. The constant current source is constituted by interposing the base-emitter junction of the transistor 100 between the base and collector of the transistor 99. The collectors of the transistors 93 and 94 constituting the constant current source are connected to the respective emitters of the transistors 63 and 64 constituting the differential amplifier 12. Similarly, each collector of the transistors 95, 96, 97 and 98 constituting the constant current source is connected to the respective emitters of the transistors 81, 82, 83 and 84 of the differential amplifiers 13 and 14. The bases of the transistors for the constant current source are connected to the base of the transistor 99, so that the constant currents of $I_1$, $I_2$, $I_3$ and $I_4$ are supplied.

The input signal voltage source 1 is connected to the differential amplifier 11 and the input signal voltage source 2 is connected to the differential amplifier 14. Numerals 102 and 103 indicate transistors of the emitter follower type for supplying the DC bias to the bases of the transistors 61 and 62. Numerals 104 and 105 represent transistors of the emitter follower type for supplying the DC bias to the bases of the transistors 83 and 84. Furthermore, reference numerals 106, 107, 108 and 109 denote emitter follower type transistors for supplying the DC bias to the bases of the transistors 64 and 82.

The outputs of the differential amplifiers 11 and 13 are supplied to the multiplier 19 and the outputs of the differential amplifiers 12 and 14 are supplied to the multiplier 20. The output current is obtained at the common connecting point of each collector of the transistors 32, 33, 42 and 43 of these multipliers 19 and 20. In this second embodiment, a current mirror circuit consisting of a diode 114 and a pnp-type transistor 115 is used, to obtain the current output at the output terminal 113. This output terminal 113 is connected to the intermediate connecting point of a resistance series circuit (not shown) interposed between the power source line 111 and the ground, so that the output current is converted into the output voltage and is further fetched through an emitter follower type transistor.

Figure 13:
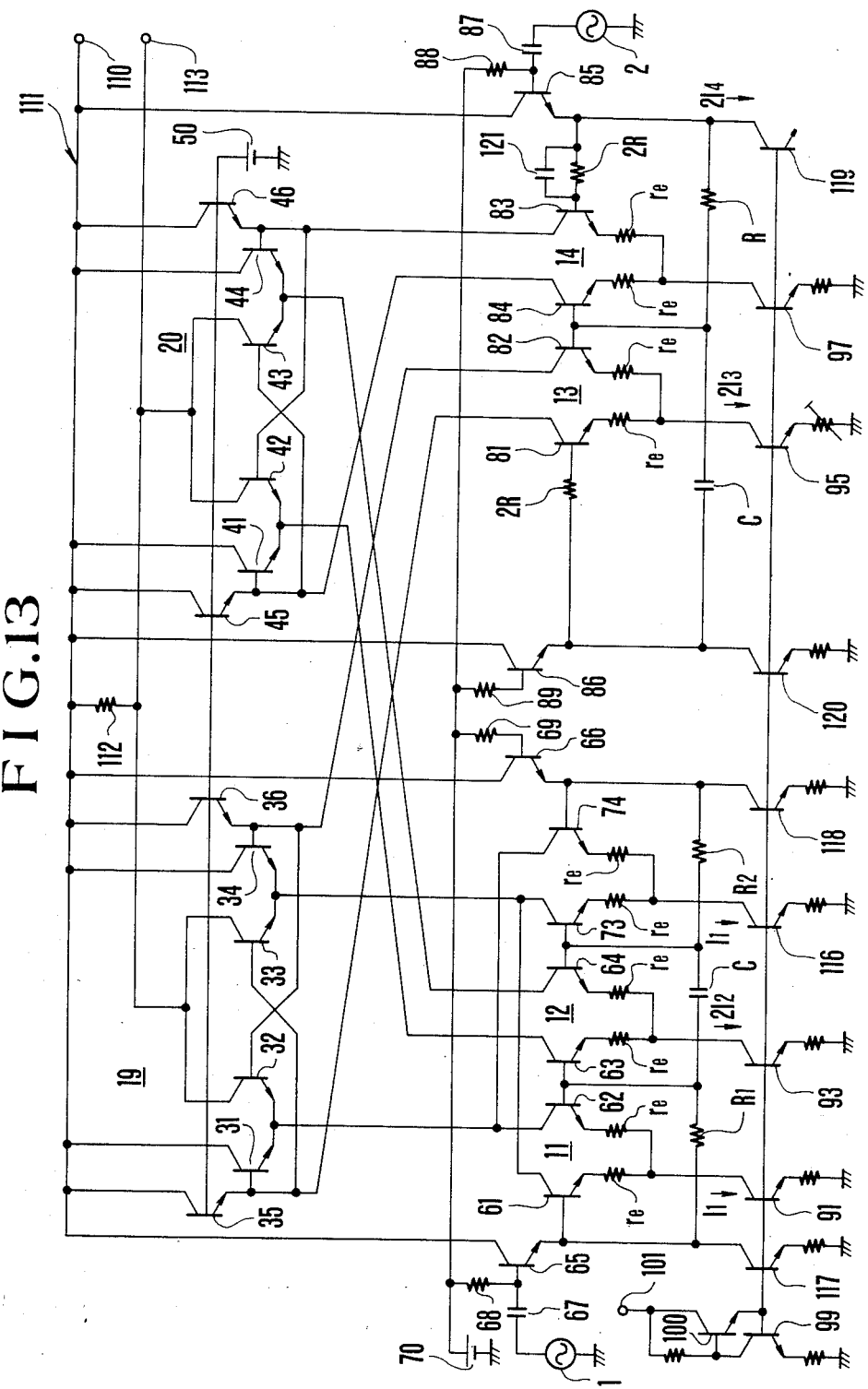
FIG. 13 is a connection diagram showing a third embodiment of the present invention.

FIG. 13 shows a third embodiment of the present invention. This third embodiment uses the differential amplifiers of the arrangement shown in FIG. 10 as the differential amplifiers 11 and 12 and uses the differential amplifiers of the arrangement shown in FIG. 9 as the differential amplifiers 13 and 14.

The differential amplifier consisting of the transistors 73 and 74 is connected to the differential amplifier 11 in order to compensate the DC balance. Reference numerals 91, 93, 116, 117 and 118 denote transistors constituting the constant current source. In addition, the differential amplifiers 13 and 14 are constituted such that the base resistor 2R for keeping the DC balance is connected in the manner similar to the constitution shown in FIG. 9. A capacitor 121 connected in parallel to the base resistor 2R of the transistor 83 serves to compensate the phase deviation (unnecessary phase change). Numerals 95, 97, 119 and 120 are transistors constituting the constant current source. A variable impedance element is used as the emitter resistance of the transistor 95, thereby enabling the gain to be adjusted.

It may be possible to use the differential amplifiers of the arrangement of FIG. 10 as the differential amplifiers 13 and 14. However, the carrier leak to be caused since the DC or AC balance of the differential amplifiers 13 and 14 is lost becomes the component of the frequency $f_1$ and this frequency is apart from the necessary output frequency $(f_1+f_2)$, so that it can be removed by a filter. Therefore, the number of circuit elements is reduced using the differential amplifiers of the arrangement of FIG. 9 as the differential amplifiers 13 and 14.

In addition, the output currents of the differential amplifiers 11 and 13 are supplied to the multiplier 19 and the output currents of the differential amplifiers 12 and 14 are supplied to the multiplier 20. The outputs of these multipliers 19 and 20 are converted into the voltage output by the load resistance 112 and it is fetched at the output terminal 113.

The present invention can be applied to the circuit for forming the sum or difference of two signals of single frequencies in addition to an SSB modulator.

According to the present invention, which differs from the conventional in that phase shifters and multipliers are connected as separate circuit blocks, the circuit arrangement can be simplified and at the same time it is possible to realize a constitution without any adjusting means or a constitution in that simple adjusting circuits are used.

Specifically, firstly, it is unnecessary to adjust the carrier balance of the multipliers. Secondly, the use of the phase shifter made as an IC allows the temperature fluctuation of the values of the circuit elements to be made similar, thereby eliminating the need for the adjustment of the phase shift amounts. Thirdly, it is unnecessary to perform the adjustment at the synthesizing point of the outputs of two multipliers and a constitution is possible whereby the gain of one differential amplifier is controlled by a DC voltage.

Since the present invention has these features, the number of externally attached parts can be reduced and it is possible to realize a constitution which is extremely suitable for making an IC.

Although the present invention has been shown and described with respect to preferred embodiments, various changes and modifications which are obvious to a person skilled in the art to which the invention pertains are deemed to lie within the spirit and scope of the invention.

What is claimed is:

1. A sum or differential frequency signal generating circuit to which input signals of first and second frequencies are supplied and which generates an output signal of the frequency of the sum or difference of said first and second frequencies, said signal generating circuit comprising:
    first and second differential amplifiers to which the input signal of said first frequency is supplied and which generate differential first and second output currents having a phase difference of 90° with each others;
    third and fourth differential amplifiers to which the input signal of said second frequency is supplied and which generate differential third and fourth output currents having a phase difference of 90° with each other;
    a first multiplier, constituted by a differential amplifier, for generating the multiplication output current of the output currents of said first and third differential amplifiers;
    a second multiplier, constituted by a differential amplifier, for generating the multiplication output current of the output currents of said second and fourth differential amplifiers; and
    an output terminal at which the output currents of said first and second multipliers are synthesized and fetched.

2. A sum or differential frequency signal generating circuit according to claim 1, wherein a gain control circuit is provided for at least one differential amplifier of said first, second, third or fourth differential amplifier.

3. A sum or differential frequency signal generating circuit according to claim 1, wherein a resistor and a capacitor are respectively inserted in the loop current line of said first and second differential amplifiers, thereby generating a differential output current having a phase difference of 90°.

4. A sum or differential frequency signal generating circuit according to claim 1, wherein a resistor and a capacitor are respectively inserted in the loop current line of said third and fourth differential amplifiers, thereby generating a differential output current having a phase difference of 90°.

5. A sum or differential frequency signal generating circuit according to claim 1, wherein the base of one transistor of said first differential amplifier and the base of one transistor of said second differential amplifier are connected and a series circuit consisting of a resistor and a capacitor is interposed between the base of the other transistor of the first differential amplifier and the base of the other transistor of the second differential amplifier, and wherein the connecting point of said resistor and said capacitor and the base connecting point of said transistors are connected, thereby adding said first input signal to said series circuit.

6. A sum or differential frequency signal generating circuit according to claim 1, wherein the base of one transistor of said third differential amplifier and the base of one transistor of said fourth differential amplifier are connected and a series circuit consisting of a resistor and a capacitor is interposed between the base of the other transistor of the third differential amplifier and the base of the other transistor of the fourth differential amplifier, and wherein the connecting point of said resistor and said capacitor and the base connecting point of said transistors are connected, thereby adding said second input signal to said series circuit.

7. A sum or differential frequency signal generating circuit according to claim 4, wherein a fifth differential amplifier is connected in parallel to said first differential amplifier and the DC balance of the first differential amplifier is kept by said fifth differential amplifier.

8. A sum or differential frequency signal generating circuit according to claim 4, wherein a sixth differential amplifier is connected in parallel to said third differential amplifier and the DC balance of the third differential amplifier is kept by said sixth differential amplifier.

9. A sum or differential frequency signal generatoing circuit according to claim 5, wherein a fifth differential amplifier is connected in parallel to said first differential amplifier and the DC balance of the first differential amplifier is kept by said fifth differential amplifier.

10. A sum or differential frequency signal generating circuit according to claim 6, wherein a sixth differential amplifier is connected in parallel to said third differential amplifier and the DC balance of the third differential amplifier is kept by said sixth differential amplifier.

* * * * *